United States Patent

Brage

[54] ELECTRODE WITH MULTIPLE CARBON FIBRE CONTACT SURFACE

[75] Inventor: Anders Brage, Sollentuna, Sweden

[73] Assignee: Försvarets Forskningsanstalt, Stockholm, Sweden

[21] Appl. No.: 09/043,725

[22] PCT Filed: Sep. 25, 1996

[86] PCT No.: PCT/SE96/01202

§ 371 Date: May 26, 1998

§ 102(e) Date: May 26, 1998

[87] PCT Pub. No.: WO97/12419

PCT Pub. Date: Apr. 3, 1997

[30] Foreign Application Priority Data

Sep. 26, 1995 [SE] Sweden .................................. 9503325

[51] Int. Cl.[7] .................................................. H01Q 21/00
[52] U.S. Cl. .............................. 343/867; 343/742; 429/30
[58] Field of Search .................................... 343/866, 867, 343/741, 742, 719; 204/409; 429/26, 30, 34, 42, 44, 194

[56] References Cited

U.S. PATENT DOCUMENTS

| | | | |
|---|---|---|---|
| 4,443,309 | 4/1984 | Van Duin et al. ...................... | 204/149 |
| 4,576,706 | 3/1986 | Takata et al. ............................ | 204/409 |
| 5,429,875 | 7/1995 | Okamoto ................................. | 428/547 |
| 5,436,092 | 7/1995 | Ohtsuka et al. ......................... | 429/194 |
| 5,652,056 | 7/1997 | Pepin ....................................... | 428/364 |
| 5,672,439 | 9/1997 | Wilkinson et al. ....................... | 429/40 |
| 5,955,215 | 9/1999 | Kurzweil et al. ......................... | 429/41 |

FOREIGN PATENT DOCUMENTS 42 39 538   11/1993   Germany .

[11] Patent Number: 6,104,357
[45] Date of Patent: Aug. 15, 2000

*Primary Examiner*—Tan Ho
*Attorney, Agent, or Firm*—Jacobson, Price, Holman & Stern, PLLC

[57] ABSTRACT

An electrode having a contact surface with the electrolyte consisting of a number of carbon fibers (1), and a method for the manufacture of an electrode where a number of carbon fibers (1) are wound into a carbon fiber skein (2) whereupon the skein (2) is gathered together at a connection area and embedded to form a connecting stud (5), which is then treated so that the end surfaces (6) appear of all the carbon fibers gathered together in the connecting stud (5), after which the carbon fiber end surfaces (6) are connected to a signal conductor (8). And an antenna (12) comprising electrically connected electrodes where the contact surface of each electrode with the electrolyte consists of a number of carbon fibers (1).

10 Claims, 1 Drawing Sheet

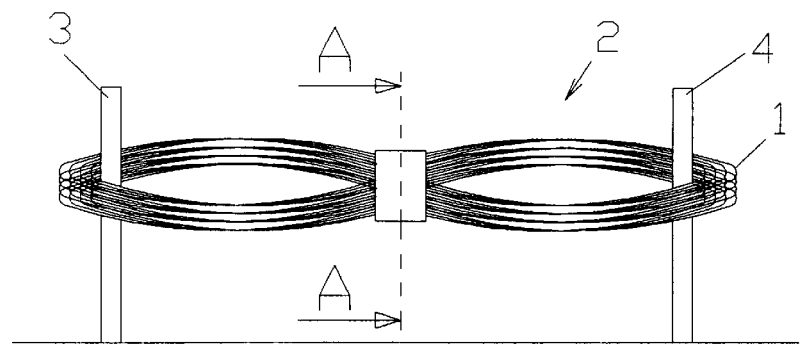
Fig 1
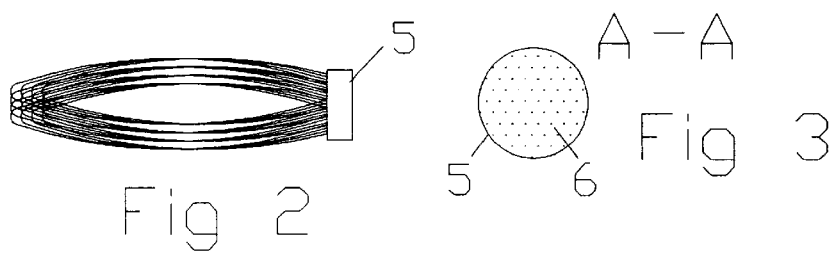
Fig 2  Fig 3
Fig 4
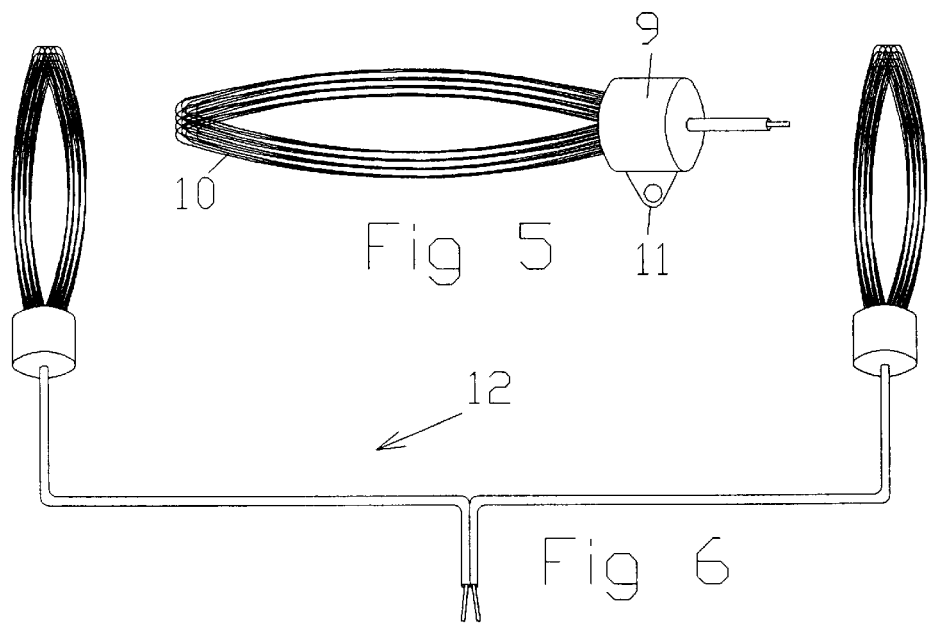
Fig 5
Fig 6

ELECTRODE WITH MULTIPLE CARBON FIBRE CONTACT SURFACE

TECHNICAL FIELD

The present invention relates to the technique of achieving a large area of contact and a good connection between a conductive electrode and the electrolyte which is in contact with the electrode. The electrolyte could for instance be in the form of either salt water or fresh water. Such an electrode with water as electrolyte can be used for measuring purposes or as a part of an antenna construction. With this large area of contact, very small changes in electrical fields can be measured, whereby the electrode can be used for instance for measuring of water-currents.

BACKGROUND OF THE INVENTION

For detecting changes in the electrical field under water, pairs of different kinds of electrodes, made of zinc, graphite, silver/silver chloride etc., have previously been used. They have all had their benefits and drawbacks, such as silver/silver chloride electrodes having high sensitivity but at high costs, zinc electrodes having a low price but being mechanically or electrically instable, and graphite electrodes which are difficult to manufacture according to defined specifications without discarding. Large active areas have required large physical dimensions and have, in connection with graphite electrodes, caused irreproducible properties conditioned by small chemical or morphological variations. Consequently, there are significant problems with the previously available techniques.

PURPOSE OF THE INVENTION

The purpose of the invention is to solve these problems by providing an electrode based on bundles of carbon fibres which are connected to a desired conductor, and a method for manufacturing this electrode. A further purpose of the invention is to provide an underwater electrode having much better performance characteristics than previously available underwater electrodes. Furthermore, the purpose of the invention is to provide an antenna mainly for underwater measurements.

SUMMARY OF THE INVENTION

An electrode according to the invention is provided with tufts or bundles of carbon fibres which have been cleaned along the fibre surfaces to get a good electrical contact with surrounding water, and which, furthermore, have been gathered together at one end and connected to an electrical conductor.

Such a manufactured electrode constitutes, together with an electrode of the same kind, a pair of electrodes which has turned out to have good antenna properties in water. Furthermore, it is comparatively easy to manufacture. As the electrode is made by carbon fibres, which have a homogenous chemical structure all along the fibres, an electrode having reproducible properties is obtained.

BRIEF DESCRIPTION OF THE DRAWINGS

FIG. 1 shows a step in the manufacture of a device according to the is invention.

FIG. 2 shows a further step in the manufacture of a device according to the invention.

FIG. 3 shows a cross-sectional view according to FIG. 1.

FIG. 4 shows a first embodiment of the invention.

FIG. 5 shows a second embodiment of the invention.

FIG. 6 shows an antenna according to the invention.

DESCRIPTION OF THE INVENTION

An electrode according to the invention is produced by winding a bundle of carbon fibres into a carbon fibre skein 2, which is then gathered together at a connection area where the carbon fibres are bound together to form a connecting stud 5, which is then treated so that the end surfaces 6 will appear of all the carbon fibres gathered together in the connecting stud 5, after which the carbon fibres are connected to a signal conductor 8 through their end surfaces 6.

The electrode according to the invention is suitably produced, see FIG. 1, by winding carbon fibres 1, in the form of a bundle of generally 6000 carbon fibres, approximately 50 turns around two end poles 3,4 with an intermediate distance of about half a meter, into a skein 2. These chosen values of the number of carbon fibres, the number of turns and the distance, will result in an electrode having approximately 600 000 carbon fibre ends for connection to a signal conducting cable. With these values, the area of contact with the electrolyte will be fully 3 $m^2$.

The oblong skein 2 of fibres is loosened carefully and is fixed in the middle thereof, for instance with a piece of shrinkage hose. After cutting in the middle of the piece of shrinkage hose, the ends of the two carbon fibre bundles fitted with hose are embedded in epoxy plastic in vacuum so that a connecting stud 5 is formed, see FIG. 2, which after curing is shaped by means of grinding tools. The connecting stud 5 is grinded until all the end surfaces 6 of the carbon fibres appear in the grinding surface, see FIG. 3. On these carbon fibre end surfaces a metallic coating is applied, see FIG. 4, which forms a connecting plate 7 for connection of a signal conducting cable 8. After the connection, the connection place is embedded in epoxy plastic to form a protective cover 9 for shielding the contact surfaces from water influence. Thereafter, the epoxy coating which the fibres have been given during their manufacture is cleaned off from the fibre surfaces. This coating has generally been applied to improve the wetting properties of the fibres and their ability of binding to an epoxy matrix, and it constitutes a layer having insulating properties. Through the cleaning, the fibres, and thereby also the electrode, have been adapted for use in electro-chemical applications. The cleaning is carried out in a normal way with different solvents, for instance with acetone, alcohol and water in turns. Between the different steps in the manufacturing process it is checked that none of the individuals differ in various aspects from empirically obtained set values, to make sure that the different individuals in a manufacturing process are as equal as possible regarding for instance electric resistance, length etc.

The manufacturing process is finished by cutting open the loop-shaped carbon fibre tufts 10, if a brush-like appearance with a lot of fibre ends sticking out in the water is desired, see FIG. 4. Otherwise the carbon fibres remain in a loop-shape, see FIG. 5, so that an attachment is possible in both ends, whereby a similar utilization in water is possible independent of the spatial orientation of the attachment. Final assembling with mounting ears 11 for mechanical fixation and with a water permeable flow protection around the fibres is done in the easiest way, after which final testing and verification of the individuals, i.e. each electrode, is done in laboratory.

Another possible method of manufacturing is to form the connecting stud 5 at first, by making an embedment at the middle part of the carbon fibre skein 2, after which the connecting stud 5 is bisected and the carbon fibre end surfaces 6 of each bisecting surface are connected to a signal conductor 8 in the way mentioned above. The connection place is then embedded and the fibres are cleaned in accordance with what is mentioned above.

With the present type of electrode a large active area of an inert kind with small external physical dimensions and an extremely high reproducibility and mechanical durability is combined in a new way with a simplified manufacturing technique. Two electrodes can also be combined to form a reliable and cost effective antenna 12, see FIG. 6, for detecting variations in the electrical field under water.

Possible utilizations include could be scientific measurements of the geological E-field, measurement of sea-heave and water-currents, detection and measurement of ship movements, or signal transmission between water vessels or divers with limited range of voice messages.

What is claimed is:

1. An electrode having a contact surface that is able to contact an electrolyte, wherein the contact surface includes a plurality of carbon fibres, with at least one of their two ends gathered together and electrically connected to a signal conductor through end surfaces of the carbon fibres.

2. The electrode according to claim 1, wherein the carbon fibres in both of their ends are gathered together and electrically connected to the signal conductor.

3. A method for the manufacture of an electrode, wherein a bundle of carbon fibres is wound into a carbon fibre skein, after which the carbon fibre skein is gathered together at a connection area where it is bound together to form a connecting stud, that the connecting stud is treated to make the end surfaces appear of all the carbon fibres gathered together in the connecting stud, and that the carbon fibre end surfaces thereafter are connected to a signal conductor.

4. The method according to claim 3, wherein the connecting stud is formed by making an embedment of the carbon fibre skein at the connection area, and that the connecting stud thereafter is bisected whereupon the carbon fibre end surfaces of each bisecting surface are connected to the signal conductor.

5. The method according to claim 3, wherein the carbon fibre skein is cut in the connection area whereupon thereby obtained end piece is embedded, and that the connecting stud formed by the embedment is grinded until all the end surfaces of the carbon fibres appear in the grinding surface.

6. The method according to claim 3, wherein the signal conductor is connected to the carbon fibre end surfaces through a metallic coating which is applied on the carbon fibre end surfaces.

7. The method according to claim 6, wherein the connecting stud, the carbon fibre end surfaces, the metallic coating and a part of the signal conductor are embedded in a polymeric substance to form a protective cover.

8. The method according to claim 7, wherein the carbon fibres used for the manufacturing of the electrode have an epoxy coating which is cleaned off from the fibre surfaces by means of different solvents.

9. An antenna comprising electrically connected electrodes, each electrode having a contact surface that is able to contact an electrolyte, wherein the contact surface of each electrode with the electrolyte includes a plurality of carbon fibres with at least one of their two ends gathered together and electrically connected to a signal conductor through end surfaces of the carbon fibres.

10. The antenna according to claim 9, wherein the carbon fibres in both of their ends are gathered together and electrically connected to the signal conductor.

* * * * *